(12) United States Patent
Nishiyama

(10) Patent No.: US 11,067,518 B2
(45) Date of Patent: Jul. 20, 2021

(54) NMR MEASUREMENT METHOD AND APPARATUS

(71) Applicants: RIKEN, Wako (JP); JEOL Ltd., Tokyo (JP)

(72) Inventor: Yusuke Nishiyama, Tokyo (JP)

(73) Assignees: RIKEN, Saitama (JP); JEOL Ltd., Tokyo (JP)

( * ) Notice: Subject to any disclaimer, the term of this patent is extended or adjusted under 35 U.S.C. 154(b) by 753 days.

(21) Appl. No.: 15/837,215

(22) Filed: Dec. 11, 2017

(65) Prior Publication Data
US 2018/0164234 A1 Jun. 14, 2018

(30) Foreign Application Priority Data
Dec. 12, 2016 (JP) .............................. JP2016-240448

(51) Int. Cl.
| G01N 24/08 | (2006.01) |
| G01R 33/46 | (2006.01) |
| G01R 33/56 | (2006.01) |
| G01R 33/50 | (2006.01) |
| G01R 33/44 | (2006.01) |

(52) U.S. Cl.
CPC ........... *G01N 24/082* (2013.01); *G01N 24/08* (2013.01); *G01R 33/44* (2013.01); *G01R 33/4616* (2013.01); *G01R 33/4641* (2013.01); *G01R 33/50* (2013.01); *G01R 33/5602* (2013.01);
(Continued)

(58) Field of Classification Search
CPC .... G01N 24/08; G01N 24/082; G01N 24/088; G01R 33/44; G01R 33/4608; G01R 33/4616; G01R 33/4641; G01R 33/50; G01R 33/5602; G01R 33/5605
See application file for complete search history.

(56) References Cited

U.S. PATENT DOCUMENTS

| 6,184,683 | B1 * | 2/2001 | Emsley | .............. | G01R 33/4641 |
| | | | | | 324/307 |
| 2007/0287184 | A1 * | 12/2007 | Telkki | .................... | G01R 33/44 |
| | | | | | 436/57 |

FOREIGN PATENT DOCUMENTS

JP  1305347 A  8/1989

OTHER PUBLICATIONS

Hughes, et al., New in situ solid-state NMR techniques for probing the evolution of crystallization processes: pre-nucleation, nucleation and growth, The Royal Society of Chemistry, Faraday Discuss, 2015, pp. 115-140, vol. 179.
(Continued)

Primary Examiner — Rishi R Patel
(74) Attorney, Agent, or Firm — The Webb Law Firm

(57) ABSTRACT

A whole measurement process includes a plurality of step combinations. Each of the step combinations is composed of a solution-state measurement step and a solid-state measurement step. In the solution-state measurement step, solution-state NMR measurement is performed such that magnetization that is to be used in the solid-state measurement step remains. In the solid-state measurement step, solid-state NMR measurement is performed by using the magnetization that remains. No waiting time for recovering magnetization is provided between the solution-state measurement step and the solid-state measurement step. The solid-state measurement step may be performed earlier, and the solution-state measurement step may be performed later. Alternatively, the two steps may be performed simultaneously.

7 Claims, 10 Drawing Sheets

(52) U.S. Cl.
CPC ....... *G01R 33/5605* (2013.01); *G01N 24/088* (2013.01); *G01R 33/4608* (2013.01)

(56) References Cited

OTHER PUBLICATIONS

Hughes et al., "Classic NMR": An In-Situ NMR Strategy for Mapping the Time-Evolution of Crystallization Processes by Combined Liquid-State and Solid-State Measurements, Angew. Chem. Int. Ed., 2014, pp. 8939-8943, 53.

Gopinath et al., Dual Acquisition Magic-Angle Spinning Solid-State NMR-Spectroscopy: Simultaneous Acquisition of Multidimensional Spectra of Biomacromolecules, Angew. Chem. Int. Ed., 2012, pp. 1-6, 51.

Hughes et al., Direct observation of a transient polymorph during crystallization, Chem. Commun., 2010, pp. 4982-4984, 46.

Kupce et al., Parallel Acquisition of Two-Dimensional NMR Spectra of Several Nuclear Species, J. Am. Chem. Soc., 2006, pp. 9606-9607, 128.

Hughes et al., A Technique for In Situ Monitoring of Crystallization from Solution by Solid-State 13C CPMAS NMR Spectroscopy, J. Phys. Chem. A, 2008, pp. 6808-6810, vol. 112, No. 30.

* cited by examiner

| | PROCEDURE | OBSERVATION TARGET NUCLEI OF FIRST MEASUREMENT STEP | CP APPLIED | OBSERVATION TARGET NUCLEI OF SECOND MEASUREMENT STEP |
|---|---|---|---|---|
| FIRST MEASUREMENT METHOD | SOLUTION-STATE MEASUREMENT EARLIER, AND SUBSEQUENTLY SOLID-STATE MEASUREMENT | $^{13}C$ | $^1H$-$^{13}C$ | $^{13}C$ |
| SECOND MEASUREMENT METHOD | SOLID-STATE MEASUREMENT EARLIER, AND SUBSEQUENTLY SOLUTION-STATE MEASUREMENT | $^1H$ | | $^{13}C$ |
| THIRD MEASUREMENT METHOD | SIMULTANEOUS MEASUREMENT | $^1H$ | | $^{13}C$ |
| FOURTH MEASUREMENT METHOD | SOLUTION-STATE MEASUREMENT EARLIER, AND UBSEQUENTLY SOLID-STATE MEASUREMENT | $^{13}C$ | $^1H$-$^{15}N$ | $^{15}N$ |

FIG. 13

NMR MEASUREMENT METHOD AND APPARATUS

CROSS REFERENCE TO RELATED APPLICATION

The disclosure of Japanese Patent Application No. 2016-240448 filed on Dec. 12, 2016 including the specification, claims, drawings, and abstract is incorporated herein by reference in its entirety.

TECHNICAL FIELD

The present invention relates to NMR measurement methods and apparatuses and, in particular, to a technique that combines solution-state NMR measurement and solid-state NMR measurement.

BACKGROUND

There have been proposed time-resolved nuclear magnetic resonance (NMR) measurement methods in which solution-state NMR measurement and solid-state NMR measurement are intermittently and repeatedly performed during the process of crystallization of a sample (see Colan E. Hughes, P. Andrew Williams, and Kenneth D. M. Harris, "CLASSC NMR": An In-Site NMR Strategy for Mapping the Time-Evolution of Crystallization Processes by Combined Liquid-State and Solid-State Measurements, Angew. Chem. Int. Ed. 53 (2014), 8939-8943.).

Such a measurement method is for measuring a sample which is a mixture of a liquid (liquid-state sample) and a solid (solid-state sample). The concept of liquids herein includes a sample that is in liquid state (such as a polymer melted at high temperature) and a solution that is composed of a solvent and a solute dissolved therein (such as sugar water obtained by dissolving sugar in water). As crystallization proceeds, the ratio of the solution decreases and the ratio of the solid increases. To observe this change, a plurality of solution-state measurement processes and a plurality of solid-state measurement processes are performed. Typically, solution-state measurement processes and solid-state measurement processes are performed alternately. In each of the solution-state measurement processes, solution-state NMR measurement is performed a plurality of times, and in each of the solid-state measurement processes, solid-state NMR measurement is performed a plurality of times. A relaxation delay is provided between two adjacent instances of NMR measurement. The relaxation delay is "waiting time" for recovering magnetization by forming a thermal equilibrium state in a static magnetic field.

Time required for observation of NMR signals is typically very short as compared to the waiting time. Therefore, most of the time during the above-described time-resolved NMR measurement is the waiting time. In one solution-state measurement process, for example, 128 instances of solution-state NMR measurement are performed. The waiting time required for one instance of solution-state NMR measurement is, for example, 3 seconds. Therefore, 6.4 minutes are required to obtain one solution-state NMR spectrum. The NMR measurement is repeated because individual NMR signals, which, specifically, are free induction decay (FID) signals, are typically very weak, and a significant NMR signal is obtained by obtaining a plurality of NMR signals and averaging them. On the other hand, in one solid-state measurement process, for example, 256 instances of solid-state NMR measurement are performed. The waiting time required for one instance of solid-state NMR measurement is, for example, 9 seconds. Therefore, 38.4 minutes are required to obtain one solid-state NMR spectrum.

In total, 44.8 minutes are required to obtain both of the solution-state spectrum and the solid-state spectrum. This length of time corresponds to an effective time resolution. In other words, obtaining solution-state measurement results and solid-state measurement results and, based on these measurement results, performing, for example, quantitative analysis and structural analysis of the solution and the solid are completed every 44.8 minutes. The above-described time-resolved NMR measurement is performed continuously for, for example, hours or tens of hours.

In the above-described time-resolved NMR measurement method, for example, the solution includes $^1H$ and $^{13}C$, and the solid also includes $^1H$ and $^{13}C$. In the solution-state NMR measurement, single-pulse measurement is performed for $^{13}C$ present in the solution. More specifically, $^{13}C$ is irradiated with a single pulse (90° pulse), and subsequently, an FID signal is observed. As the magnetization relaxation time of $^{13}C$ present in the solid is very long as compared to the magnetization relaxation time of $^{13}C$ present in the solution, when $^{13}C$ is excited, an FID signal coming from $^{13}C$ present in the solid is barely detected, and an FID signal coming from $^{13}C$ present in the solution is dominantly detected. On the other hand, in the solid-state NMR measurement, cross polarization magic angle spinning (CP-MAS) measurement is performed. More specifically, $^1H$ is irradiated with a single pulse, and then, magnetization is transferred from $^1H$ to $^{13}C$ using CP. Subsequently, an FID signal coming from $^{13}C$ is observed. As dipole-dipole interaction is averaged due to molecular motion in the solution, no FID signal coming from $^{13}C$ present in the solution is observed, and an FID signal coming from $^{13}C$ present in the solid is observed. The MAS method is a method for performing NMR measurement while spinning a container containing a sample, at high speed in a state in which the container is inclined at a predetermined angle (magic angle) with respect to the static magnetic field.

SUMMARY

Technical Problem

Although the above-described time-resolved NMR measurement method allows in-situ simultaneous observation of the change in the solution and the change in the solid, the whole observation takes a long time and, in particular, it is disadvantageous in that the time resolution is low. To observe a chemical reaction or crystallization in detail, or to observe a fast reaction or crystallization, the time resolution should be increased.

The present invention is directed toward increasing the time resolution in NMR measurement of a sample including a liquid and a solid. Alternatively, the present invention is directed toward reducing the waiting time for recovering magnetization in NMR measurement of a sample including a liquid and a solid.

Solution to Problem

According to one aspect of the present invention, there is provided an NMR measurement method comprising a first measurement step of performing one of solution-state NMR measurement and solid-state NMR measurement on a sample that includes a liquid and a solid; and a second measurement step of performing the other of the solution-state NMR measurement and the solid-state NMR measurement on the sample, wherein the first measurement step performs NMR measurement of nuclei A such that magnetization of nuclei B remains when the second measurement step starts, wherein the second measurement step performs NMR measurement of nuclei C by using the magnetization that remains in the nuclei B, and wherein the second measurement step is either performed subsequent to the first measurement step without magnetization recovery waiting time after the first measurement step, or performed concurrently with the first measurement step.

In the above-described structure, the observation target of the first measurement step is nuclei A, and the observation target of the second measurement step is nuclei C. The nuclei C are nuclei that are the same as the nuclei A, nuclei that are the same as the nuclei B, or nuclei that are different from both the nuclei A and the nuclei B. The symbols A, B, and C here represent the types of the nuclei. The preserved magnetization of the nuclei B (macroscopic magnetization) serves as a precondition for exciting the nuclei B in the second measurement step. The direction of the magnetization is typically in parallel to the static magnetic field direction, but may be a direction perpendicular to the static magnetic field direction or may be any other direction.

In the above-described structure, on the precondition that the magnetization of the nuclei B is used in the second measurement step, NMR measurement whose observation target is the nuclei A is performed in the first measurement step such that the magnetization of the nuclei B remains when the second measurement step starts (so as to avoid impairing magnetization that is to be used in the second measurement step, or so as to preserve such magnetization). Subsequently, in the second measurement step, NMR measurement whose observation target is the nuclei C is performed by using the magnetization of the nuclei B. As such, it is unnecessary to provide waiting time for recovering magnetization between the first measurement step and the second measurement step. In other words, the second measurement step can be performed immediately after the first measurement step, or the second measurement step can be performed concurrently with the first measurement step. Although some waiting time for recovering magnetization may be required after the second measurement step, in the above-described structure, the total waiting time can be significantly reduced, and, under certain conditions, the total waiting time can be reduced, for example, by half or more compared to the conventional example. As a result, in time-resolved measurement, the time resolution can be increased, and a fast chemical reaction or crystallization can be observed. Depending on the circumstances, after the first measurement step is completed, a certain length of blank time may be provided before the second measurement step starts. However, the blank time is shorter than the magnetization recovery waiting time required in the conventional method.

The first measurement step is one of solution-state NMR measurement and solid-state NMR measurement, and the second measurement step is the other of the solution-state NMR measurement and the solid-state NMR measurement. The difference between the properties of solids and solutions is used to observe an FID signal coming from observation target nuclei present in a solution and an FID signal coming from observation target nuclei present in a solid. The observation targets of the first measurement step and the second measurement step may be the same nuclei. In this case, in the second measurement step, the magnetization of the nuclei B may be transferred to the nuclei C (the same as the nuclei A) to observe an FID signal coming from the nuclei C. In this case, for example, the nuclei A are $^{13}$C nuclei, the nuclei B are $^{1}$H nuclei, and the nuclei C are $^{13}$C nuclei. Alternatively, in the second measurement step, the nuclei B in which magnetization is preserved may be the observation target nuclei (that is, the nuclei C) without transferring the magnetization. In this case, for example, the nuclei A are $^{13}$C nuclei, the nuclei B are $^{1}$H nuclei, and the nuclei C are $^{1}$H nuclei. Alternatively, in the second measurement step, the magnetization of the nuclei B may be transferred to the nuclei C that are different from the nuclei A and the nuclei B to, then, observe an FID signal coming from the nuclei C. In this case, for example, the nuclei A are $^{13}$C nuclei, the nuclei B are $^{1}$H nuclei, and the nuclei C are $^{15}$N nuclei.

In a preferred embodiment, the above-described NMR measurement method is a time-resolved measurement method for intermittently observing a chemical reaction process or a crystallization process, wherein an observation process is performed repeatedly, wherein the observation process is composed of magnetization recovery waiting time; and a step combination subsequent to the magnetization recovery waiting time, the step combination being composed of the first measurement step and the second measurement step. Although magnetization recovery waiting time is provided between two adjacent step combinations, because no magnetization recovery waiting time is included within each of the step combinations, the time required for performing the observation process can be shortened, or, in other words, the time resolution is increased.

In an embodiment, the first measurement step is a solution-state NMR measurement step whose observation target is the nuclei A present in the solution, and the second measurement step is performed subsequent to the first measurement step, and is a solid-state NMR measurement step whose observation target is the nuclei C present in the solid. The second measurement step may be started before the first measurement step is completed, if this does not affect the first measurement step. Conversely, as described above, a certain length of blank time may be provided between the first measurement step and the second measurement step. In an embodiment, the solid-state NMR measurement step comprises a magnetization transfer step of using dipole-dipole interaction that transfers the magnetization of the nuclei B to the nuclei C; and, after the magnetization transfer step, a detection step of detecting an FID signal coming from the nuclei C. To perform the magnetization transfer step, for example, cross polarization (CP) is used. The concept of solids herein includes liquid crystal. Magnetization transfer by using dipole-dipole interaction can also be performed in liquid crystal.

According to another aspect of the present invention, there is provided an NMR measurement apparatus comprising a sample container for containing a sample that includes a liquid and a solid, the sample container placed in a static magnetic field; measurement means for irradiating the sample with an RF wave and detecting an NMR signal coming from the sample; transmission and reception means for supplying a transmission signal to the measurement means and processing a reception signal output from the measurement means; and control means for setting a pulse sequence that is to be performed by the transmission and reception means, wherein the pulse sequence includes a first subsequence and a second subsequence, wherein the first subsequence is a subsequence for performing NMR measurement of nuclei A such that magnetization of nuclei B remains when the second subsequence starts, wherein the second subsequence is a subsequence for performing NMR measurement of nuclei C by using the magnetization that remains in the nuclei B, and wherein the second subsequence is either performed subsequent to the first subsequence without magnetization recovery waiting time after the first subsequence, or performed concurrently with the first subsequence.

The control means may have the function of automatically checking whether or not the waiting time between the first subsequence and the second subsequence can be reduced. Further, the control means may have the function of configuring or reconfiguring a pulse sequence so as to preserve the magnetization of the nuclei B.

BRIEF DESCRIPTION OF DRAWINGS

Embodiments of the present disclosure will be described by reference to the following figures, wherein:

FIG. 13 lists observation target nuclei and other information for each of the measurement methods.

DESCRIPTION OF EMBODIMENTS

Figure 1:
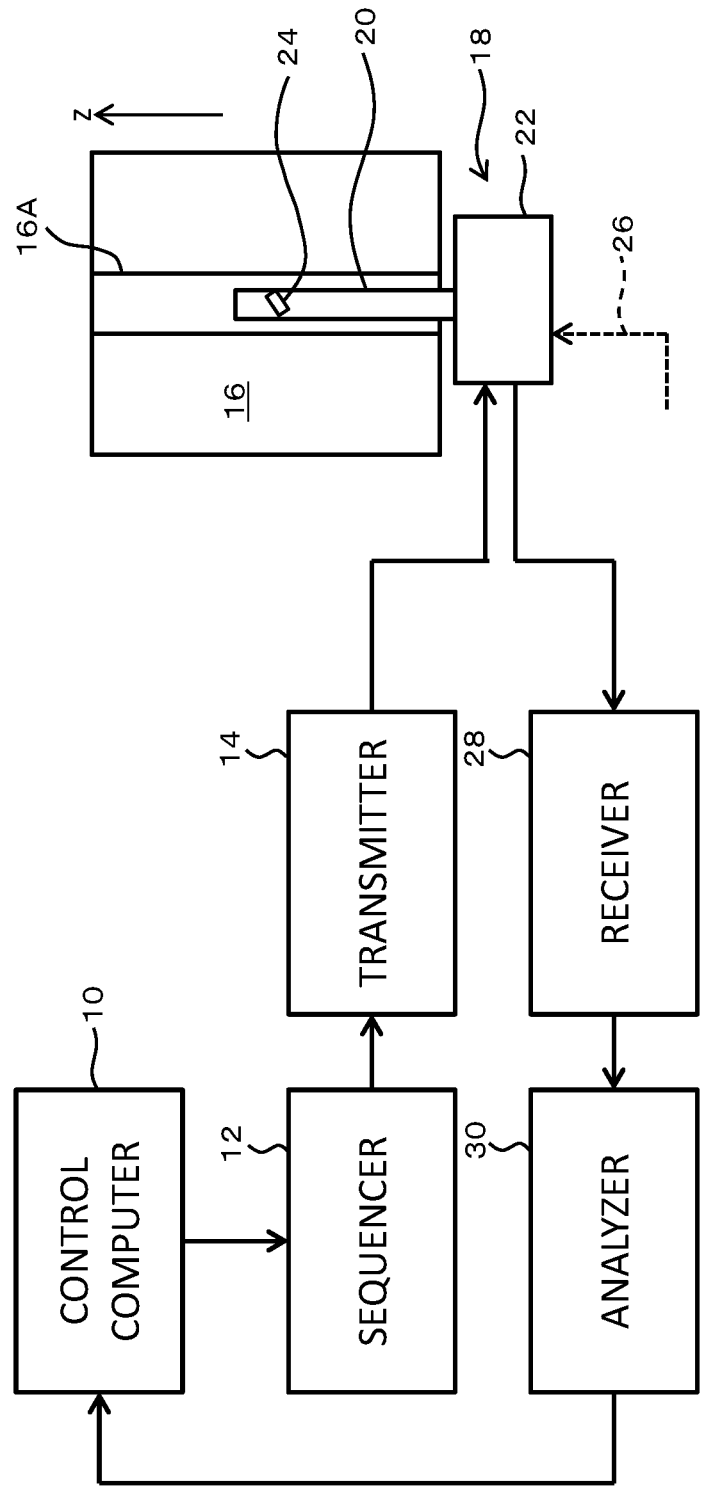
FIG. 1 is a block diagram illustrating an example structure of an NMR measurement apparatus according to the present invention.

Embodiments will be described below with reference to the accompanying drawings. FIG. 1 illustrates a block diagram of a schematic structure of an NMR measurement apparatus according to the present invention. The NMR measurement apparatus observes in situ the process of a chemical reaction and, in particular, the process of crystallization in a sample, and performs a time-resolved measurement method. The sample is a mixture sample in which a liquid (liquid-state sample) and a solid (solid-state sample) are mixed together. Typically, the sample is a liquid or a solution in its initial state.

In an example structure illustrated in FIG. 1, a control computer 10 serves as the control means, and controls the operation of components illustrated in FIG. 1. The control computer 10 is composed of a personal computer, a special-purpose computer, or another information processing device. The control computer 10 has the function of generating a pulse sequence program (a series of instructions) in accordance with measurement conditions input by a user. The pulse sequence program is a program that defines a pulse sequence, and an actual pulse sequence is generated by interpreting this program. The user may directly write or set a pulse sequence.

As will be described in detail later, a series of processes for observing a crystallization process includes a plurality of special step combinations, and each of the step combinations is composed of a solution-state measurement step and a solid-state measurement step. A magnetization recovery waiting time is provided between two step combinations that are adjacent to each other on a time axis, but no magnetization recovery waiting time is provided within each of the step combinations. Optionally, a blank period may be provided in each of the step combinations; however, the blank period is shorter than the magnetization recovery waiting time required in the conventional method.

The control computer 10 may have the function of automatically checking whether or not a pulse sequence includes an unnecessary waiting time. Alternatively, the control computer 10 may have the function of configuring or reconfiguring a pulse sequence so as to satisfy magnetization preservation conditions, which will be described below.

A sequencer 12 generates a pulse sequence in accordance with the pulse sequence program. Specifically, the sequencer 12 controls the operation of a transmitter 14 to generate a transmission signal (a series of transmission pulses) in accordance with the pulse sequence. The sequencer 12 also controls the operation of a receiver 28. The transmitter 14 is an electronic circuit that includes, for example, a signal generating circuit, a signal adder, and a power amplifier. The transmission signal is transmitted to a probe 18. The transmitter 14 and the receiver 28 serve as the transmission and reception means.

The probe 18 serves as the measurement means, and is composed of an insertion 20 and a base 22. The insertion 20 is inserted in a bore 16A formed in a static magnetic field generator 16. The base 22 is provided at the bottom of the insertion 20. A tip portion of the insertion 20 is a probe head, and a sample tube 24 is rotatably provided inside the probe head. The sample tube 24 is provided in a state in which it is inclined at a predetermined angle (magic angle) with respect to the static magnetic field direction (z direction). Reference numeral 26 represents a passageway through which driving air is introduced. The sample tube is rotatably held inside the probe head by a stator (rotational actuator), and driving air is fed to the stator. By means of the force of such air, the sample tube is driven to spin.

As described above, a magic angle spinning (MAS) system is formed in the NMR measurement apparatus according to the illustrated embodiment. Cross polarization (CP) is used during the solid-state measurement, as will be described below; as such, in terms of the solid-state NMR measurement, a CP-MAS system is formed in the NMR measurement apparatus according to the illustrated embodiment. It should be understood that the solid-state NMR measurement can also be performed without spinning the sample tube, and that the solid-state NMR measurement can also be performed by using a technique other than CP.

The probe 18 irradiates the sample with a radio frequency (RF) wave based on the transmission signal, and outputs a reception signal by detecting an NMR signal (FID signal) coming from the sample. An electric circuit for this purpose is provided in the probe 18. This electric circuit includes, for example, a detection coil, a tuning capacitor, and a matching capacitor. A sample (solution) that has been treated in a predetermined manner is placed in the sample tube 24, and then, the sample tube 24 is set in the probe head.

The receiver 28 is an electronic circuit that includes, for example, a demodulator and an A/D converter. A digital reception signal output from the receiver 28 is transmitted to an analyzer 30. The analyzer 30 performs addition processing (addition averaging processing) on a plurality of solution-state FID signals obtained in a plurality of first periods, one signal every first period, and performs FFT processing on an FID signal obtained after the addition processing, to generate, for example, a solution-state spectrum. Similarly, the analyzer 30 performs addition processing (addition averaging processing) on a plurality of solid-state FID signals obtained in a plurality of second periods, one signal every second period, and performs FFT processing on an FID signal obtained after the addition processing, to generate, for example, a solid-state spectrum. The first period and the second period may be the same or may be different from each other. Quantitative analysis and structural analysis, for example, of the solution are performed based on the solution-state spectrum obtained every plurality of first period. Also, quantitative analysis and structural analysis, for example, of the solid are performed based on the solid-state spectrum obtained every plurality of second period. Typically, the amount of the solution and the amount of the solid are analyzed at regular time intervals, and the results of the analysis are plotted on a time axis.

Although an NMR measurement method performed in the above-described NMR measurement apparatus will be described later, a comparative example will now be described with reference to FIG. 2.

Figure 2:
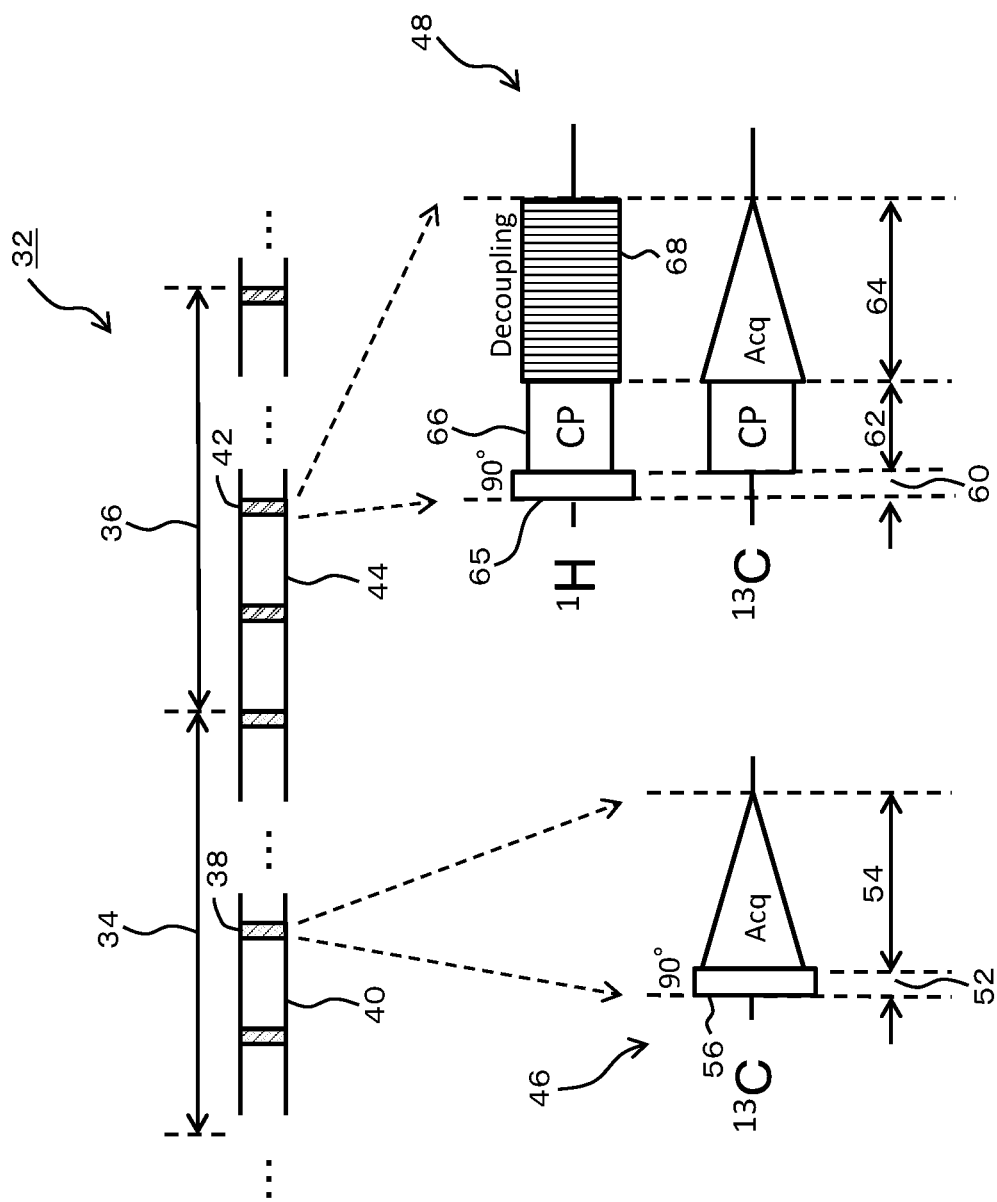
FIG. 2 illustrates an NMR measurement method serving as a comparative example.

In the comparative example illustrated in FIG. 2, a whole measurement process 32 is composed of a plurality of solution-state measurement processes 34 and a plurality of solid-state measurement processes 36. The solution-state measurement processes 34 and the solid-state measurement processes 36 are performed alternately. Each of the solution-state measurement processes 34 includes a plurality of solution-state measurement steps 38. Similarly, each of the solid-state measurement processes 36 includes a plurality of solid-state measurement steps 42. Waiting time 40 for recovering magnetization is provided before each of the solution-state measurement steps 38. Similarly, waiting time 44 for recovering magnetization is provided before each of the solid-state measurement steps 42. The solution-state measurement processes 34 and the solid-state measurement processes 36 can be understood to each correspond to an addition averaging period.

In each of the solution-state measurement steps 38, pulse irradiation is performed in accordance with a first pulse sequence 46. The first pulse sequence 46 includes irradiation with a 90° pulse 56 in a period 52. As the irradiation with the pulse 56 changes the direction of magnetization of $^{13}C$ present in the solution from the z-axis direction to a direction perpendicular to the z-axis direction, transverse magnetization occurs. In a subsequent detection period 54, an FID signal produced in the process of relaxation of this transverse magnetization is detected. The magnetization relaxation time of $^{13}C$ present in the solid is very long compared to the magnetization relaxation time of $^{13}C$ present in the solution; therefore, the FID signal detected in the detection period 54 can be considered to be an FID signal coming from $^{13}C$ present in the solution.

On the other hand, in each of the solid-state measurement steps 42, pulse irradiation is performed in accordance with a second pulse sequence 48. The second pulse sequence 48 includes irradiation with a 90° pulse 65 in a period 60, CP (irradiation for CP) 66 performed in a period 62, and $^{1}H$ decoupling (irradiation for decoupling) 68 performed in a detection period 64. The irradiation with the 90° pulse 65 causes transverse magnetization to occur in $^{1}H$, and CP causes this transverse magnetization to be transferred from $^{1}H$ to $^{13}C$. An FID signal produced during the relaxation process of the transverse magnetization is detected. Because no magnetization transfer is caused by CP in the solution, the detected FID signal can be considered to be an FID signal coming from $^{13}C$ present in the solid. In this comparative example, the whole measurement process 32 includes much waiting time 40 and 44. This is the reason why the time resolution is not increased.

Next, measurement methods according to some embodiments will be described below.

Figure 3:
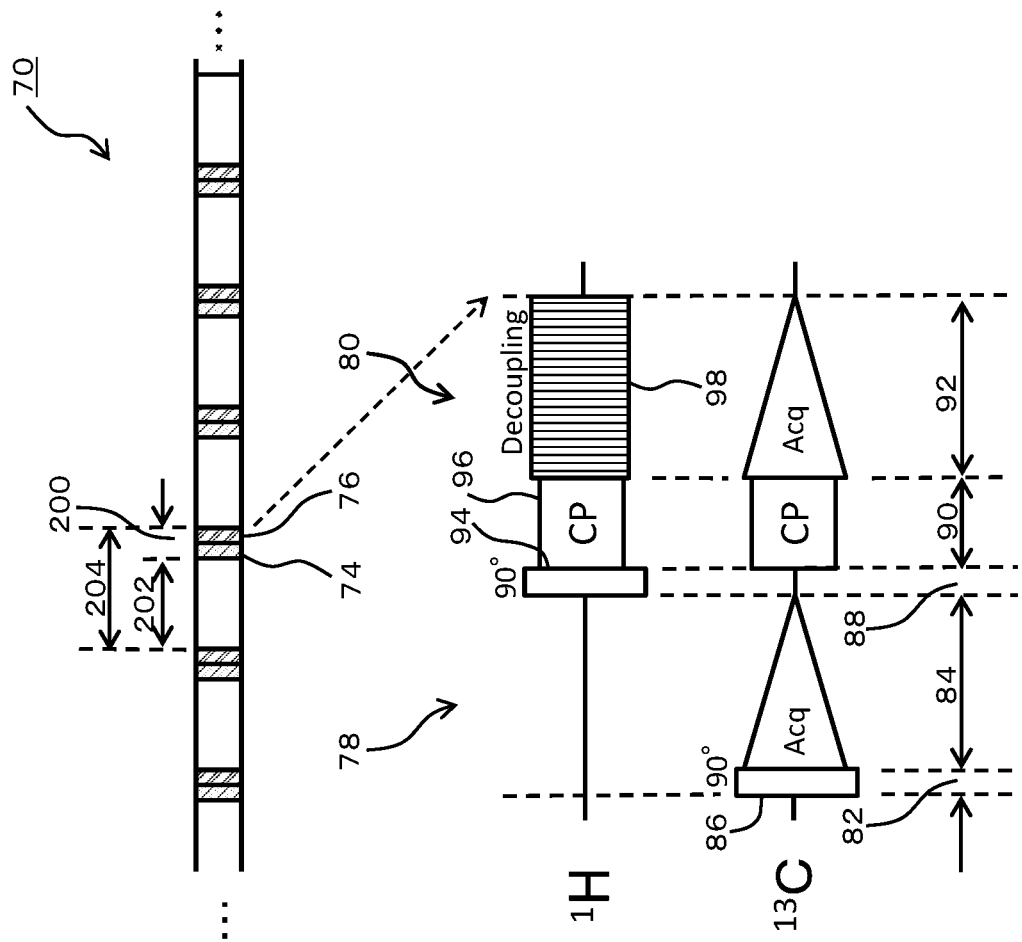
FIG. 3 illustrates an NMR measurement method according to a first embodiment.

FIG. 3 illustrates an NMR measurement method according to a first embodiment. A whole measurement process 70 includes a plurality of step combinations 200. Each of the step combinations 200 is composed of a solution-state measurement step 74 corresponding to the first measurement step and a solid-state measurement step 76 corresponding to the second measurement step. Waiting time 202 for recovering magnetization is provided before each of the step combinations 200. However, no waiting time for recovering magnetization is provided during each of the step combinations 200, or, specifically, between the solution-state measurement step 74 and the solid-state measurement step 76. In the solution-state measurement step 74, NMR measurement is performed so as not to impair magnetization that is to be used in the following solid-state measurement step 76. The whole measurement process 70 is composed of a plurality of observation processes (units of observation) 204 that are successive on a time axis, and each of the observation processes 204 is composed of the waiting time 202 and a subsequent step combination 200.

The method will be specifically described below. In the solution-state measurement step 74, irradiation with a series of pulses is performed in accordance with a first pulse sequence (the first subsequence) 78. The first pulse sequence 78 includes irradiation with a 90° pulse (π pulse or single pulse) in a period 82. In a detection period 84 that is subsequent to the period 82, an FID signal coming from $^{13}C$ present in the solution is detected. No irradiation of $^{1}H$ is performed in the solution-state measurement step 74, and the magnetization of $^{1}H$ is maintained until the following solid-state measurement step 76 starts. In the illustrated example, no $^{1}H$ decoupling is performed in the period 84.

In the solid-state measurement step 76, irradiation with a series of pulses is performed in accordance with a second pulse sequence (the second subsequence) 80. The second pulse sequence 80 includes irradiation with a 90° pulse 94 in a period 88, CP (irradiation for CP) 96 performed in a period 90, and $^{1}H$ decoupling (irradiation for decoupling) 98 performed in a detection period 92. The 90° pulse 94 causes transverse magnetization to occur in $^{1}H$, and CP causes this magnetization to be transferred from $^{1}H$ to $^{13}C$. In the detection period 92, an FID signal coming from $^{13}C$ present in the solid is detected. In the solid-state measurement step 76, dipole-dipole interaction between $^{1}H$ and $^{13}C$ is used, and, specifically, solid-state NMR measurement is performed in accordance with the above-described CP-MAS method.

The first embodiment provides an advantage in that, because, in the preceding first measurement step, NMR measurement is performed such that magnetization (specifically, magnetization of $^{1}H$) that is to be used in the following second measurement step will remain, it is unnecessary to provide waiting time for recovering magnetization between the first measurement step and the second measurement step.

Specifically, as illustrated in FIG. 3, the second pulse sequence 80 starts immediately after the first pulse sequence 78 with no waiting time for recovering magnetization between them. As such, the time required for NMR measurement can be correspondingly shortened. With the whole measurement process 70 in view, the total waiting time can be reduced, for example, by half as compared to the comparative example illustrated in FIG. 2. In other words, the time resolution can be, for example, doubled as compared to the comparative example. As a result, a fast phenomenon that cannot be measured in the comparative example can be measured.

Next, some modification examples of the first embodiment will be described below with reference to FIGS. 4 through 8. In the figures described below, elements similar to the elements illustrated in FIG. 3 are denoted by the same reference numerals, and the description of those elements is not repeated here.

Figure 4:
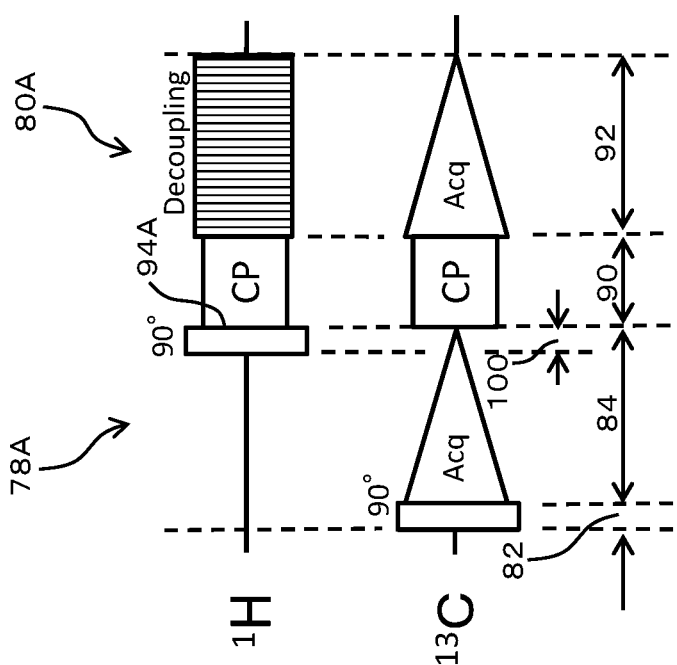
FIG. 4 illustrates a first modification example of the first embodiment.

FIG. 4 illustrates a first modification example. A first pulse sequence 78A is the same as the first pulse sequence 78 illustrated in FIG. 3, and a second pulse sequence 80A is the same as the second pulse sequence 80 illustrated in FIG. 3. However, the second pulse sequence 80A starts before the first pulse sequence 78A is completed. Specifically, as a sub-period 100 that comes the last in the detection period 84 is used as an irradiation period of a 90° pulse 94A, the sequences partially overlap each other. The time required for performing a step combination can be shortened by an amount corresponding to the cut amount. Because the sub-period 100 typically has a length of time on the order of microseconds, the effect in reducing time is rather small.

Figure 5:
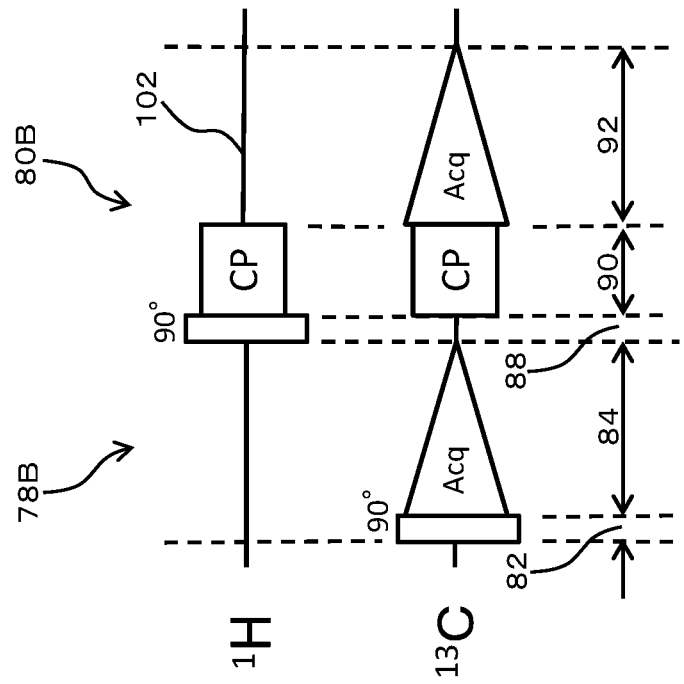
FIG. 5 illustrates a second modification example of the first embodiment.

FIG. 5 illustrates a second modification example. A first pulse sequence 78B is the same as the first pulse sequence 78 illustrated in FIG. 3. A second pulse sequence 80B corresponds to the pulse sequence 80 illustrated in FIG. 3, but from which $^1$H decoupling is eliminated (see reference numeral 102). As described above, if the circumstances allow, $^1$H decoupling may be eliminated from the solid-state NMR measurement step.

Figure 7:
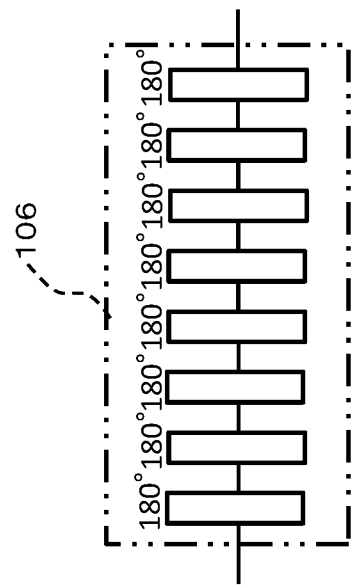
FIG. 7 illustrates an example structure of a portion of the third modification example.
Figure 6:
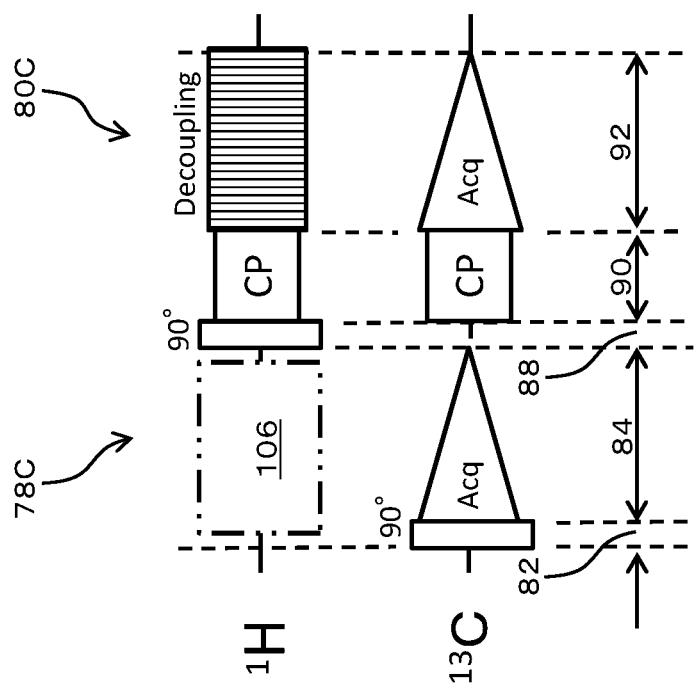
FIG. 6 illustrates a third modification example of the first embodiment.

FIG. 6 illustrates a third modification example. A first pulse sequence 78C corresponds to the first pulse sequence 78 illustrated in FIG. 3, but to which a series of pulses (pulse series irradiation) 106 is added. A second pulse sequence 80C is the same as the pulse sequence 80 illustrated in FIG. 3. In the pulse series irradiation 106, as illustrated in FIG. 7, for example, irradiation with a plurality of 180° pulses is performed. FIG. 7 merely illustrates an example, and the pulse series 106 may be of any form that recovers or maintains magnetization in the end. Irradiation with, for example, four 90° pulses may be performed.

Figure 8:
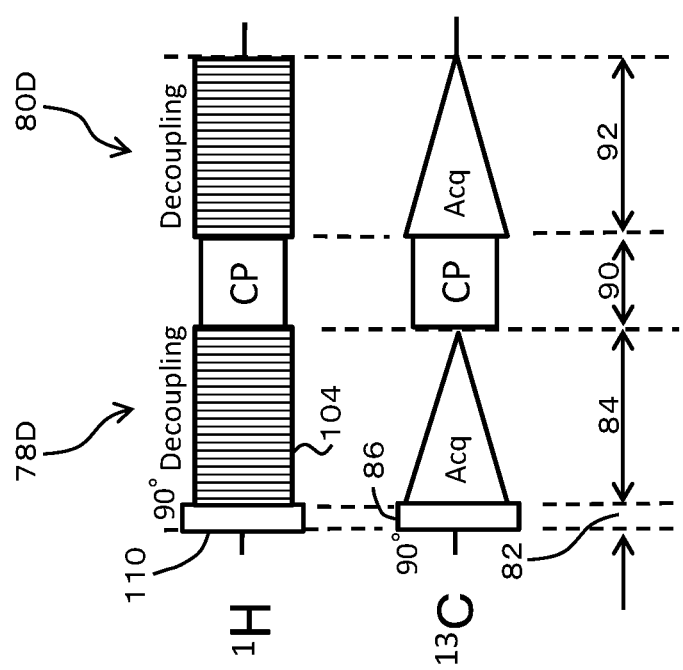
FIG. 8 illustrates a fourth modification example of the first embodiment.

FIG. 8 illustrates a fourth modification example. A first pulse sequence 78D corresponds to the first pulse sequence 78 illustrated in FIG. 3, but to which a 90° pulse 110 and $^1$H decoupling 104 are added. A second pulse sequence 80D corresponds to the pulse sequence 80 illustrated in FIG. 3, but from which the 90° pulse is eliminated. The 90° pulse 110 causes transverse magnetization to occur in $^1$H, and this transverse magnetization is maintained by spin locking through the $^1$H decoupling 104 until the solid-state NMR measurement step starts. In the solid-state NMR measurement step, the transverse magnetization that has already occurred (preserved) is transferred to $^{13}$C by CP, and an NMR signal coming from $^{13}$C present in the solid is detected. Although, in the fourth modification example, rather than longitudinal magnetization, transverse magnetization is maintained, the fourth modification example shares the same feature with the first embodiment and its first to third modification examples in that, in a preceding measurement step, magnetization required in a following measurement step is maintained or preserved.

In the first embodiment, assuming that the observation target in the first measurement step (solution-state measurement step) is represented as nuclei A, that the magnetization used in the second measurement step (solid-state measurement step) is represented as magnetization of nuclei B, and that the observation target in the second measurement step is represented as nuclei C, then the nuclei A and the nuclei B are different from each other, the nuclei B and the nuclei C are different from each other, and the nuclei A and the nuclei C are the same. In other words, the observation targets in the two measurement steps are the same. Alternatively, the observation targets in the two measurement steps may be different from each other. In the second measurement step, for example, dipole-dipole interaction between $^1$H and $^{15}$N may be used. In this case, $^{15}$N serves as the nuclei C.

Optionally, a certain length of blank time may be provided between the first pulse sequence 78 and the second pulse sequence 80. However, the blank time differs from, and is shorter than, the waiting time for recovering magnetization. To further increase the time resolution, it is preferred that no such blank time is provided.

Figure 9:
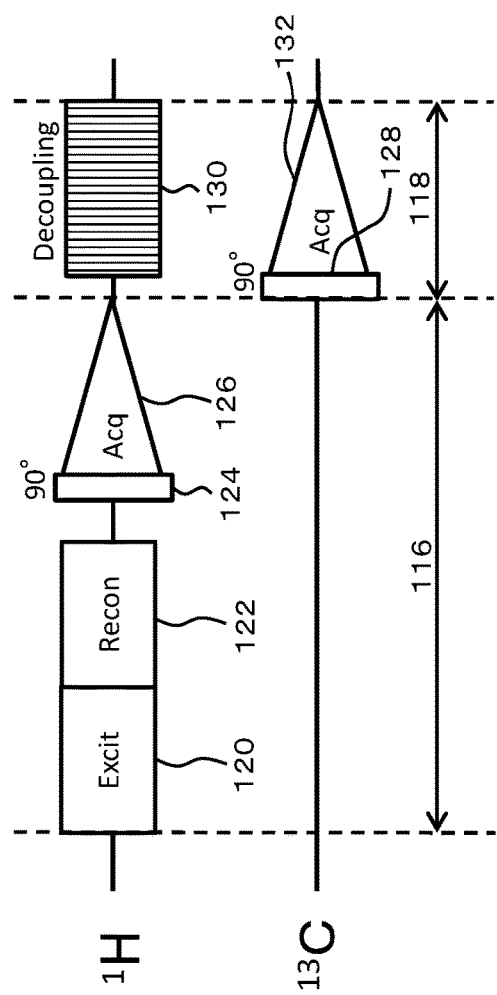
FIG. 9 illustrates an NMR measurement method according to a second embodiment.

Next, a second embodiment will be described below with reference to FIG. 9. In the second embodiment, the first measurement step is a solid-state measurement step 116, and the second measurement step is a solution-state measurement step 118. In other words, the solid-state measurement step 116 is performed earlier, and, immediately after that, the solution-state measurement step 118 is performed. Similarly to the first embodiment, no waiting time is provided between the two measurement steps 116 and 118 that constitute a step combination.

In the solid-state measurement step 116, measurement is performed in accordance with a double-quantum-filter (DQF) method. Specifically, after excitation 120 and reconversion 122 are performed, irradiation with a 90° pulse 124 is performed, and an FID signal is detected in a subsequent detection period 126. By using this DQF method, magnetization of nuclei other than the irradiation target nuclei $^1$H can be maintained, or, in other words, magnetization of $^{13}$C can be maintained at the start of the solution-state measurement step 118. In the solution-state measurement step 118, irradiation with a 90° pulse 128 is performed. As a result, transverse magnetization occurs in $^{13}$C. An FID signal produced during the relaxation process of this magnetization is detected in a detection period 132. In the detection period 132, $^1$H decoupling 130 is also performed. Similarly to the first embodiment, waiting time for recovering magnetization is provided before the step combination illustrated in FIG. 9. An observation process composed of waiting time for recovering magnetization and a step combination is performed repeatedly.

Figure 10:
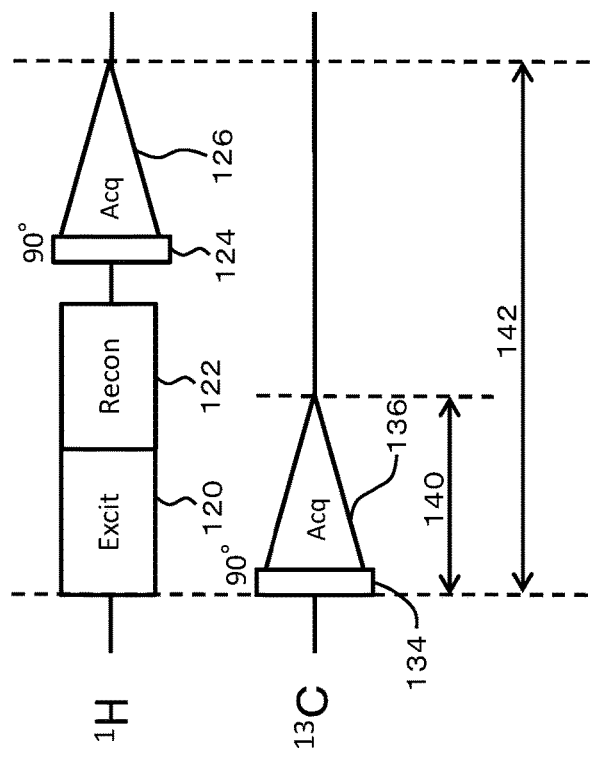
FIG. 10 illustrates an NMR measurement method according to a third embodiment.

Next, a third embodiment will be described below with reference to FIG. 10. In the third embodiment, a solid-state measurement step 142 serving as the first measurement step and a solution-state measurement step 140 serving as the second measurement step are performed concurrently. Specifically, similarly to the above-described second embodiment, in the solid-state measurement step 142, after excitation 120 and reconversion 122 are performed in accordance with a DQF method, irradiation with a 90° pulse 124 is performed, and an FID signal is detected in a subsequent detection period 126. By using the DQF method, because no influence is exerted on nuclei other than the irradiation target nuclei $^1$H, in the solution-state measurement step 140, irradiation with a 90° pulse 134 is performed, and then, an FID signal is detected in a detection period 136. The two measurement steps 140 and 142 illustrated in FIG. 10 can also be collectively referred to as a step combination. Similarly to the first and second embodiments, waiting time for recovering magnetization is provided before the step combination. An observation process composed of waiting time for recovering magnetization and a step combination is performed repeatedly.

Figure 11:
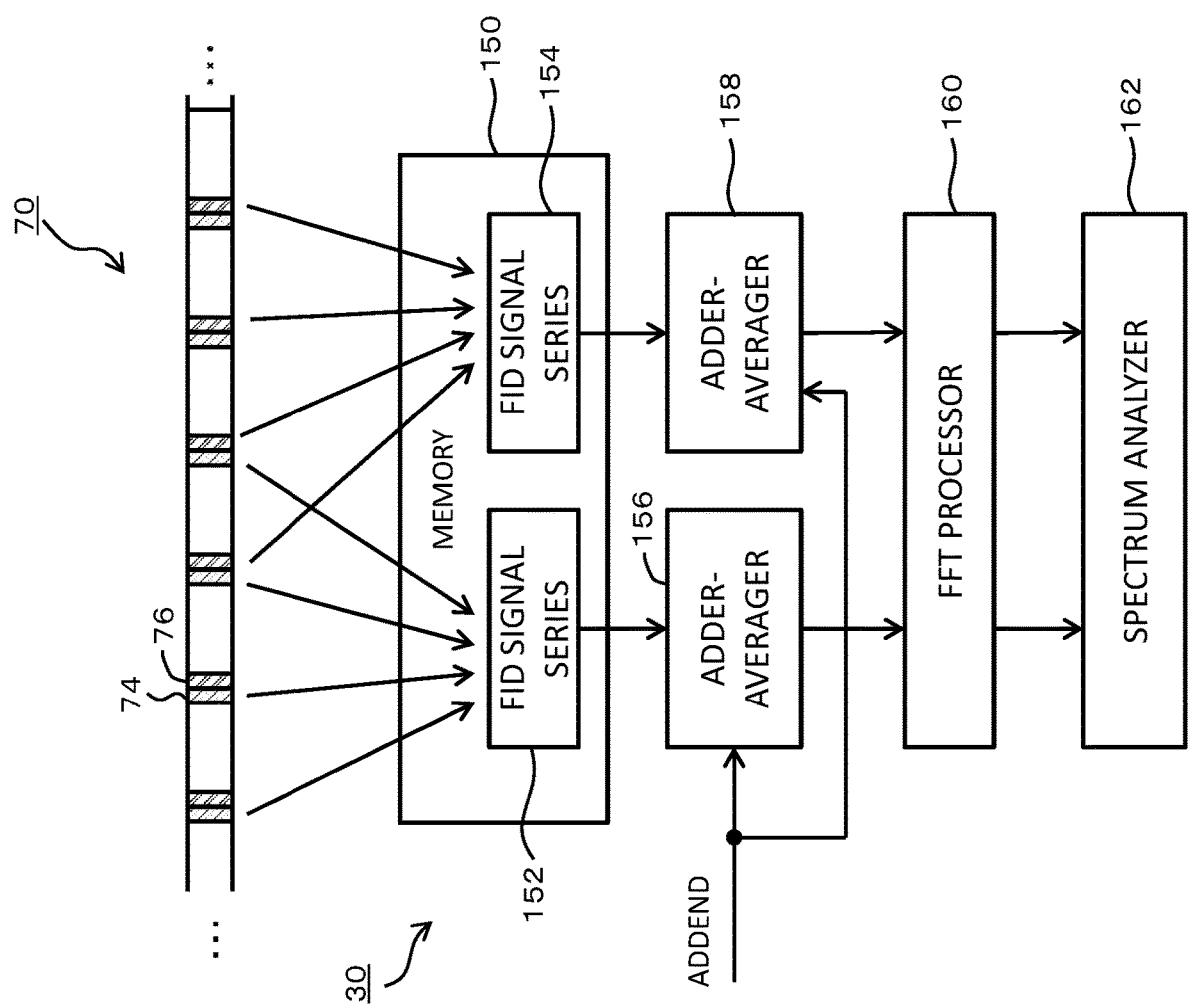
FIG. 11 illustrates an example of FID signal processing.

FIG. 11 illustrates a concept of signal processing performed in the NMR measurement apparatus illustrated in FIG. 1. The whole measurement process 70 includes, as described above, a plurality of step combinations, and each of the step combinations is composed of a solution-state measurement step 74 and a solid-state measurement step 76. They are performed successively in time or performed simultaneously. FID signals (digital reception information) obtained in the solution-state measurement steps 74 are successively stored in a memory 150. These signals constitute an FID signal series 152. Similarly, FID signals (digital reception information) obtained in the solid-state measurement steps 76 are successively stored in the memory 150. These signals constitute an FID signal series 154.

An adder-averager 156 performs addition averaging processing on the FID signal series 152 to thereby generate a post-addition-averaging FID signal. This signal is transmitted to an FFT processor 160, and a solution-state spectrum is generated. Similarly, an adder-averager 158 performs addition averaging processing on the FID signal series 154 to thereby generate a post-addition-averaging FID signal. This signal is transmitted to the FFT processor 160, and a solid-state spectrum is generated.

A spectrum analyzer 162 analyzes solution-state spectra and solid-state spectra obtained at regular time intervals. For example, the amount of the solution and the amount of the solid are determined. Structures of substances in the solution or structures of substances in the solid may be analyzed. The results of the analysis are plotted on a time axis.

To perform the addition averaging processing for the solution and the addition averaging processing for the solid, although, typically, the same addend is used for both the solution and the solid, different addends may be used. In the comparative example illustrated in FIG. 2, the addend, or, in other words, the time resolution, is fixed, whereas, in the illustrated embodiment, the addend can be easily varied as desired, or, in other words, the time resolution (the time for obtaining one spectrum) can be easily set as desired. Based on the solution-state spectra and the solid-state spectra, the addend may be controlled through feedback control. In either case, according to the illustrated embodiment, if the conditions are the same, the waiting time can be significantly reduced as compared to the comparative example.

The memory 150, the adder-averager 156, the adder-averager 158, the FFT processor 160, and the spectrum analyzer 162 illustrated in FIG. 11 are provided in the analyzer 30 illustrated in FIG. 1. All or part of these functions may be implemented in the form of the function of the control computer 10.

Figure 12:
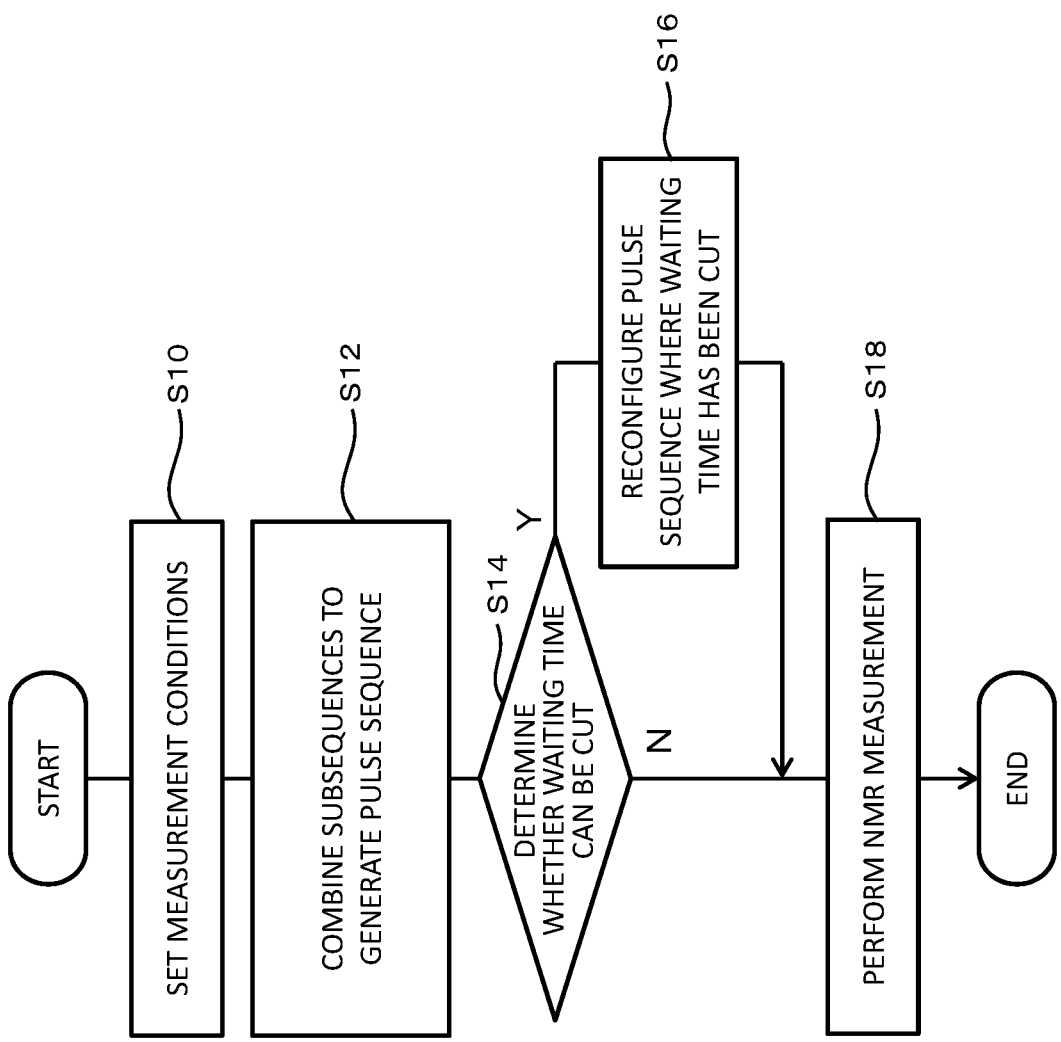
FIG. 12 illustrates an example operation of the NMR measurement apparatus illustrated in FIG. 1.

FIG. 12 illustrates an example operation of the NMR measurement apparatus illustrated in FIG. 1. In S10, a user sets measurement conditions. In S12, a pulse sequence is automatically generated based on the measurement conditions. The pulse sequence includes a combination of a plurality of subsequences. In S14, the process determines whether or not one or more of a plurality of periods of magnetization recovery waiting time included in the pulse sequence can be eliminated. In particular, the process determines whether or not, in a preceding step, magnetization that is to be used in a later step is preserved, and, therefore, one or more of a plurality of periods of magnetization recovery waiting time can be eliminated. If there is any waiting time that can be eliminated, in S16, the process automatically reconfigures a pulse sequence where unnecessary waiting time has been cut. Subsequently, in S18, NMR measurement is performed in accordance with the pulse sequence.

The control computer 10 illustrated in FIG. 1 may be configured to check the waiting time. Alternatively, a pulse sequence may be automatically configured from the beginning, so as to satisfy the magnetization preservation conditions, and so as to minimize the waiting time.

Referring to FIG. 13, observation target nuclei and other information are itemized for the above-described embodiments. A first measurement method corresponds to the first embodiment (FIG. 3) and the first to fourth modification examples (FIGS. 4 to 8). A second measurement method corresponds to the second embodiment (FIG. 9). A third measurement method corresponds to the third embodiment (FIG. 10). A fourth measurement method corresponds to another modification example of the first embodiment (the difference from the first embodiment is that the nuclei C are third nuclei, as will be described below). Reference numeral 164 indicates the order of the first measurement step and the second measurement step; that is, which of these steps is performed earlier than the other. Reference numeral 166 indicates the observation target nuclei of the first measurement step (nuclei A). Reference numeral 168 indicates the relationship of CP applied in the second measurement step (nuclei B and nuclei C). Reference numeral 170 indicates the observation target nuclei of the second measurement step (nuclei C).

In the first measurement method, the first measurement step detects an NMR signal coming from $^{13}$C (nuclei A), while magnetization of $^{1}$H (nuclei B) is maintained. The subsequent second measurement step applies CP between $^{1}$H (nuclei B) and $^{13}$C (nuclei C), and detects an NMR signal coming from $^{13}$C (nuclei C, which are the same as nuclei A). In the second measurement method, the first measurement step detects an NMR signal coming from $^{1}$H (nuclei A), while magnetization of $^{13}$C (nuclei B) is maintained. The subsequent second measurement step detects an NMR signal coming from $^{13}$C (nuclei C, which are the same as nuclei B). In the third measurement method, the first measurement step detects an NMR signal coming from $^{1}$H (nuclei A), while magnetization of $^{13}$C (nuclei B) is maintained. The second measurement step, which is performed simultaneously with the first measurement step, detects an NMR signal coming from $^{13}$C (nuclei C, which are the same as nuclei B). In the fourth measurement method, the first measurement step detects an NMR signal coming from $^{13}$C (nuclei A), while magnetization of $^{1}$H (nuclei B) is maintained. The subsequent second measurement step applies CP between $^{1}$H (nuclei B) and $^{15}$N (nuclei C), and detects an NMR signal coming from $^{15}$N (nuclei C). The nuclei C may also be, for example, $^{31}$P.

In the above-described embodiments, NMR measurement of the first measurement step is performed on the condition that magnetization that is to be used in the second measurement step is preserved, and NMR measurement of the second measurement step is performed by using the preserved magnetization. As such, in consideration of the whole measurement, the waiting time can be significantly reduced, and the time resolution is increased. Liquids and solids that dynamically change in the process of a chemical reaction or crystallization can be observed with a high time resolution.

The technique disclosed herein is useful for identifying substances and their changes in the fields of physics and chemistry. This technique is applicable to, for example, the development and analysis of secondary batteries. This technique may be used for solution-state NMR measurement of solvents and solid-state NMR measurement of solid-state electrodes.

This technique is also applicable to pharmaceuticals or other fields.

The invention claimed is:

1. A time-resolved measurement method for intermittently observing a chemical reaction process or a crystallization process comprising:
    repeatedly performing an observation process, the observation process comprising:
       (a) providing a magnetization recovery waiting time;
       (b) a first measurement step of performing one of solution-state NMR measurement and solid-state NMR measurement on a sample that includes a liquid and a solid;
       (c) a second measurement step of performing the other of the solution-state NMR measurement and the solid-state NMR measurement on the sample; and
       (d) repeating steps (a)-(c),
    wherein the first measurement step performs NMR measurement of nuclei A such that magnetization of nuclei B remains when the second measurement step starts,
    wherein the second measurement step performs NMR measurement of nuclei C by using the magnetization that remains in the nuclei B,
    wherein the second measurement step is either performed subsequent to the first measurement step without magnetization recovery waiting time after the first measurement step, or performed concurrently with the first measurement step, and
    wherein solution-state spectra are obtained at regular time intervals by repetition of the solution-state NMR measurements and solid-state spectra are obtained at the same regular time intervals by repetition of the solid-state NMR measurements.

2. The method according to claim 1,
    wherein the nuclei C are nuclei that are the same as the nuclei A, nuclei that are the same as the nuclei B, or nuclei that are different from both the nuclei A and the nuclei B.

3. The method according to claim 1,
    wherein the second measurement step includes a magnetization transfer step of transferring the magnetization that remains in the nuclei B to the nuclei C.

4. The method according to claim 3,
    wherein the magnetization transfer step uses dipole-dipole interaction between the nuclei B and the nuclei C.

5. The method according to claim 1,
    wherein the first measurement step is a solution-state NMR measurement step whose observation target is the nuclei A present in the liquid, and
    wherein the second measurement step is performed subsequent to the first measurement step, and is a solid-state NMR measurement step whose observation target is the nuclei C present in the solid.

6. The method according to claim 5,
    wherein the solid-state NMR measurement step comprises:
    a magnetization transfer step of using dipole-dipole interaction that transfers the magnetization of the nuclei B to the nuclei C; and
    after the magnetization transfer step, a detection step of detecting an FID signal coming from the nuclei C.

7. An NMR measurement apparatus comprising:
    a sample container for containing a sample that includes a liquid and a solid, the sample container being placed in a static magnetic field;
    measurement means for irradiating the sample with an RF wave and detecting an NMR signal coming from the sample;
    transmission and reception means for supplying a transmission signal to the measurement means and processing a reception signal output from the measurement means; and
    control means for setting a pulse sequence that is to be performed by the transmission and reception means,
    wherein the pulse sequence includes a first subsequence and a second subsequence,
    wherein the first subsequence is a subsequence for performing NMR measurement of nuclei A such that magnetization of nuclei B remains when the second subsequence starts and comprises performing of one of solution-state NMR measurement and solid-state NMR measurement on the sample,
    wherein the second subsequence is a subsequence for performing NMR measurement of nuclei C by using the magnetization that remains in the nuclei B and comprises performing the other of the solution-state NMR measurement and the solid-state NMR measurement on the sample,
    wherein the second subsequence is either performed subsequent to the first subsequence without magnetization recovery waiting time after the first subsequence, or performed concurrently with the first subsequence, and
    wherein an observation process for intermittently observing a chemical reaction process or a crystallization process is repeatedly performed, the observation process comprises providing a magnetization recovery waiting time prior to performing the first subsequence, and
    wherein the NMR measurement of nuclei A is obtained at regular time intervals by repetition of the first subsequence and the NMR measurement of nuclei C is obtained at the same regular time intervals by repetition of the second subsequence.

* * * * *